United States Patent
Hsu et al.

(10) Patent No.: US 11,101,177 B1
(45) Date of Patent: Aug. 24, 2021

(54) SEMICONDUCTOR STRUCTURE AND METHOD FOR FORMING THE SAME

(71) Applicant: Winbond Electronics Corp., Taichung (TW)

(72) Inventors: Che-Jui Hsu, Taichung (TW); Chun-Sheng Lu, Taichung (TW); Ying-Fu Tung, Taichung (TW); Mao-Chang Yen, Taichung (TW); Wan-Yu Peng, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/794,525

(22) Filed: Feb. 19, 2020

(51) Int. Cl.
*H01L 29/66* (2006.01)
*H01L 21/8234* (2006.01)
(Continued)

(52) U.S. Cl.
CPC .......... *H01L 21/823443* (2013.01); *H01L 21/823468* (2013.01); *H01L 29/4991* (2013.01);
(Continued)

(58) Field of Classification Search
CPC ..... H01L 29/06; H01L 29/0649; H01L 29/49; H01L 29/4991; H01L 29/66; H01L 29/665; H01L 23/482; H01L 23/4821; H01L 21/762; H01L 21/764; H01L 21/768; H01L 21/76289; H01L 21/7682; H01L 21/8234; H01L 21/823443; H01L 21/823468;
(Continued)

(56) References Cited

U.S. PATENT DOCUMENTS

| 6,900,121 | B1 * | 5/2005 | Ngo ..................... H01L 21/3105 257/E21.241 |
| 2001/0014533 | A1 * | 8/2001 | Sun ...................... H01L 29/4991 438/655 |

(Continued)

FOREIGN PATENT DOCUMENTS

| TW | 201622063 A | 6/2016 |
| TW | 201834145 A | 9/2018 |

OTHER PUBLICATIONS

Office Action dated Aug. 20, 2020 in TW Application No. 109101167 (6 pages).

*Primary Examiner* — Chuong A Luu
(74) *Attorney, Agent, or Firm* — Muncy, Geissler, Olds & Lowe, P.C.

(57) ABSTRACT

A method for forming a semiconductor structure includes: providing a substrate; forming a stacked structure on the substrate; forming a barrier layer on a sidewall of the stacked structure; forming a first dielectric layer covering the barrier layer and the stacked structure; removing a portion of the first dielectric layer to expose an upper portion of the stacked structure; forming a metal layer covering the stacked structure and the first dielectric layer; performing an annealing process to react the metal layer with the stacked structure to form a metal silicide layer at the upper portion of the stacked structure; removing an unreacted portion of the metal layer; removing a portion of the barrier layer to form a recess above the barrier layer; and forming a second dielectric layer covering the metal silicide layer and the first dielectric layer to form air gaps on both sides of the stacked structure.

20 Claims, 6 Drawing Sheets (51) Int. Cl.
  *H01L 29/49* (2006.01)
  *H01L 23/482* (2006.01)
  *H01L 21/764* (2006.01)
  *H01L 21/762* (2006.01)
  *H01L 21/768* (2006.01)
  *H01L 29/06* (2006.01)
(52) U.S. Cl.
  CPC ........ *H01L 29/665* (2013.01); *H01L 29/6653* (2013.01); *H01L 21/764* (2013.01); *H01L 21/7682* (2013.01); *H01L 21/76264* (2013.01); *H01L 21/76289* (2013.01); *H01L 21/76889* (2013.01); *H01L 23/4821* (2013.01); *H01L 29/0649* (2013.01)
(58) Field of Classification Search
  CPC ........... H01L 21/2815; H01L 21/28132; H01L 21/823864; H01L 29/51; H01L 29/518; H01L 29/4983; H01L 29/6656; H01L 29/66553; H01L 29/66689; H01L 29/66719
  USPC ....................................................... 257/384
  See application file for complete search history.

(56) References Cited

U.S. PATENT DOCUMENTS

| | | |
|---|---|---|
| 2005/0064635 A1 | 3/2005 | Ajmera et al. |
| 2005/0224867 A1 | 10/2005 | Huang et al. |
| 2006/0240632 A1 | 10/2006 | Park et al. |
| 2008/0254579 A1 | 10/2008 | Chi et al. |
| 2013/0049132 A1* | 2/2013 | Doris .................. H01L 21/7682 257/383 |
| 2013/0093019 A1 | 4/2013 | Ando et al. |

* cited by examiner

SEMICONDUCTOR STRUCTURE AND METHOD FOR FORMING THE SAME

BACKGROUND OF THE INVENTION

Field of the Invention

The present disclosure relates to a semiconductor structure and a method for forming the same, and in particular it relates to a flash memory device structure and a method for forming the same.

Description of the Related Art

Since flash memory has the advantages of high density, low cost, and being rewritable and electrically erasable, it has become a mainstay in non-volatile memory devices in recent years. Flash memory has been used in various portable electronic products, such as notebook computers, tablet computers, digital cameras, smartphones and other portable electronic products. In order to increase the density of components in a flash memory device and improve its overall performance, the current manufacturing technology used to make dynamic random access memory devices continues to trend toward the miniaturization of component sizes.

However, as component sizes continue to decrease, many challenges arise. In the process of manufacturing the semiconductor structure, reducing the pitch between the components will increase the difficulty of the photolithography process and the etching process. For example, when the etching process cannot reliably remove the conductive material between the conductive structures, the risk of problems such as short circuits and current leakage may increase.

Increasing the degree of accumulation and reducing the critical size of the flash memory devices often causes the memory device to experience leakage of current from word lines, short-circuiting of bit lines, and poor high-temperature data retention (HTDR).

Although the current methods for forming a flash memory device have been adequate for their intended purposes, they have not been entirely satisfactory in all respects. Therefore, the development of a process that can further improve the yield of a flash memory device is still one of the topics that the industry is aiming at.

BRIEF SUMMARY OF THE INVENTION

In accordance with some embodiments of the present disclosure, a method for forming a semiconductor structure is provided. The method includes the following steps: providing a substrate; forming a stacked structure on the substrate; forming a barrier layer on a portion of a sidewall of the stacked structure; forming a first dielectric layer covering the barrier layer and the stacked structure; removing a portion of the first dielectric layer to expose an upper portion of the stacked structure; forming a metal layer covering the stacked structure and the first dielectric layer; performing an annealing process to react the metal layer with the stacked structure to form a metal silicide layer at the upper portion of the stacked structure; removing an unreacted portion of the metal layer; removing a portion of the barrier layer to form a recess above the barrier layer; and forming a second dielectric layer covering the metal silicide layer and the first dielectric layer to form air gaps on both sides of the stacked structure.

In accordance with some embodiments of the present disclosure, a semiconductor structure is provided. The semiconductor structure includes a substrate, a stacked structure, a barrier layer, and an air gap. The stacked structure is disposed on the substrate, and an upper portion of the stacked structure includes a metal silicide layer. The barrier layer is disposed on a portion of a sidewall of the stacked structure and is in contact with a portion of the sidewall of the stacked structure. In addition, the air gap is disposed above the barrier layer.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION OF THE INVENTION

The method for forming a semiconductor structure and a semiconductor structure formed by such a method are described in detail below. It should be understood that the following description provides many different embodiments or examples for implementing different aspects of some embodiments of the present disclosure. The specific elements and configurations described in the following detailed description are set forth in order to clearly describe the present disclosure. It will be apparent that the exemplary embodiments set forth herein are used merely for the purpose of illustration and the present application is not limited thereto. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments.

The descriptions of the exemplary embodiments are intended to be read in connection with the accompanying drawings, which are to be considered part of the entire written description. It should be understood that the drawings are not drawn to scale. In fact, the size of the element may be arbitrarily enlarged or reduced in order to clearly express the features of the present disclosure. In addition, the expressions "a first material layer is disposed on or over a second material layer" may indicate that the first material layer is in direct contact with the second material layer, or that the first material layer is not in direct contact with the second material layer, there being one or more intermediate layers disposed between the first material layer and the second material layer.

In accordance with some embodiments of the present disclosure, a method for forming a semiconductor structure includes foil ling an air gap between word line structures, so as to reduce the residue of conductive materials (for example, cobalt, cobalt silicide, etc.) that may cause the risk of short circuit of the word lines, and the RC delay effect can be improved. Therefore, the data storage stability of the memory structure can be improved, which can further improve the yield and reliability of the final product.

FIGS. 1A to 1L are cross-sectional diagrams of a semiconductor structure 10 during various stages of manufacture in accordance with some embodiments of the present disclosure. It should be understood that additional operations may be provided before, during, and/or after the method for forming the semiconductor structure 10. In accordance with some embodiments, some of the stages described below may be replaced or omitted. In accordance with some embodiments, additional features may be added to the semiconductor structure 10. In accordance with some embodiments, some features of the semiconductor structure 10 described below may be replaced or omitted.

In accordance with some embodiments, the semiconductor structure 10 may include different types of nonvolatile memory structures, such as a flash memory, but the present disclosure is not limited thereto.

Figure 1A:
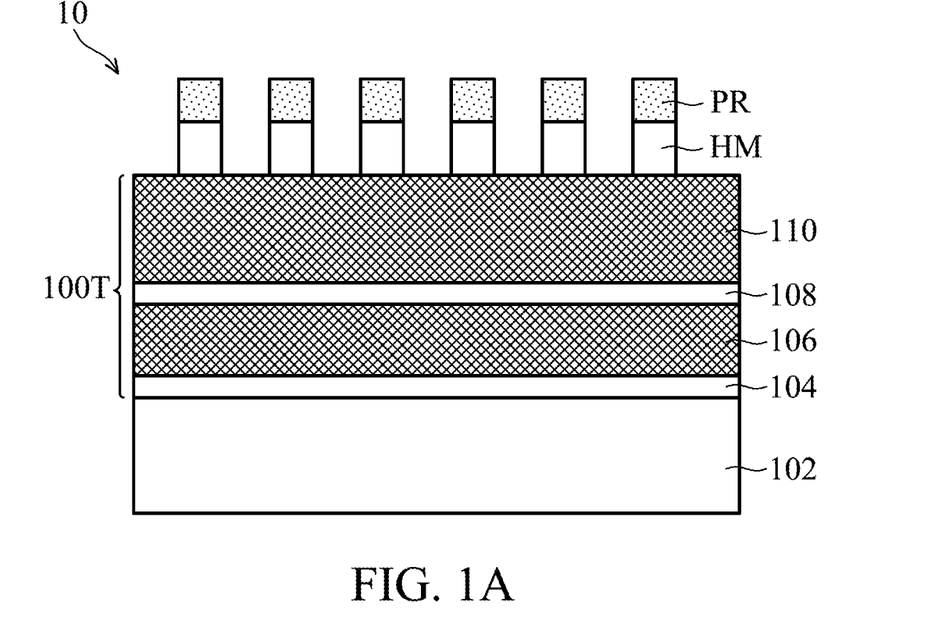
FIGS. 1A to 1L are cross-sectional diagrams of a semiconductor structure during various stages of manufacture in accordance with some embodiments of the present disclosure.

Referring to FIG. 1A, a substrate 102 is provided. In some embodiments, the substrate 102 may include an elemental semiconductor substrate.

Next, a stacked structure 100T may be formed on the substrate 102. Specifically, a tunneling dielectric layer 104, a floating gate layer 106, an inter-gate dielectric layer 108, and a control gate layer 110 may be sequentially formed on the substrate 102 to form a stack structure 100T. In some embodiments, the stacked structure 100T will be patterned in a subsequent process to form a word line structure.

In some embodiments, the material of the tunnel dielectric layer 104 may include silicon oxide, or other suitable dielectric materials. In some embodiments, the tunneling dielectric layer 104 may be formed by a chemical vapor deposition (CVD) process, a thermal oxidation process, or a combination thereof.

In some embodiments, the material of the floating gate layer 106 may include doped polycrystalline silicon, undoped polycrystalline silicon, or other suitable materials. In some embodiments, the floating gate layer 106 may be formed by a chemical vapor deposition process. In some embodiments, the material of the inter-gate dielectric layer 108 may include a composite layer composed of an oxide layer/a nitride layer/an oxide layer (oxide/nitride/oxide, ONO), for example, a composite layer composed of silicon oxide/silicon nitride/silicon oxide. It should be understood that the composite layer of the inter-gate dielectric layer 108 is not limited to three layers. In some embodiments, the inter-gate dielectric layer 108 may be formed by a chemical vapor deposition process. Furthermore, in some embodiments, the material of the control gate layer 110 may include doped polycrystalline silicon, undoped polycrystalline silicon, or other suitable dielectric materials. In some embodiments, the control gate layer 110 may be formed by a chemical vapor deposition process.

Next, as shown in FIG. 1A, a hard mask layer HM and a photoresist layer PR may be formed on the control gate layer 110. The patterned photoresist layer PR may be used to define the pattern of the hard mask layer HM, and further define the position and shape of the subsequent formed stacked structure 100T.

Figure 1B:
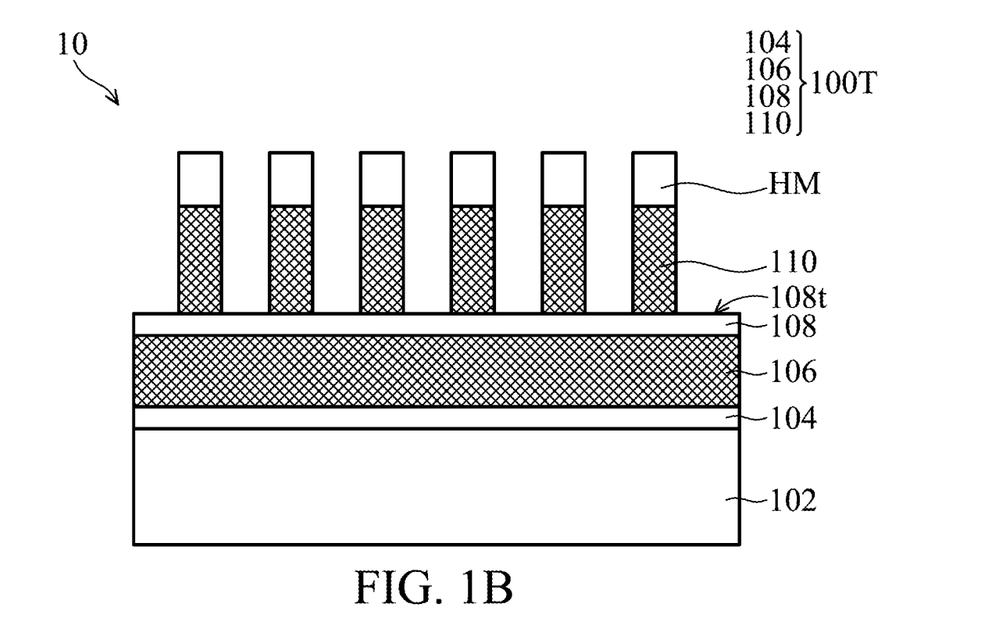

Next, referring to FIG. 1B, the patterned photoresist layer PR may be removed, and a portion of the control gate layer 110 may be removed using the hard mask layer HM as an etching mask to form the patterned control gate layer 110. In some embodiments, a portion of the control gate layer 110 may be removed to expose the top surface 108t of the inter-gate dielectric layer 108. In some embodiments, the control gate layer 110 may be removed by a dry etching process.

Figure 1C:
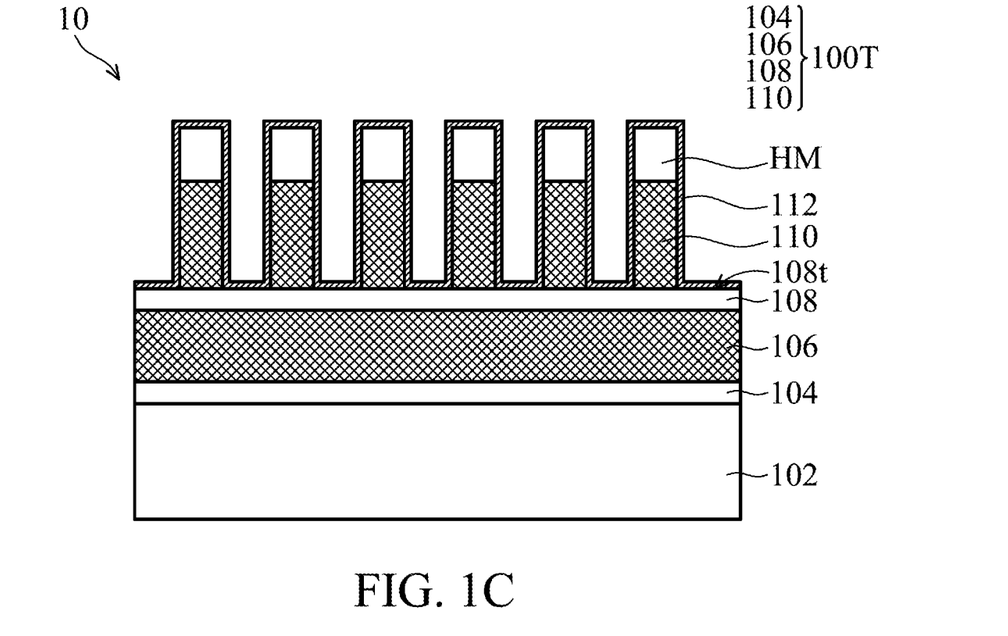
Figure 1D:
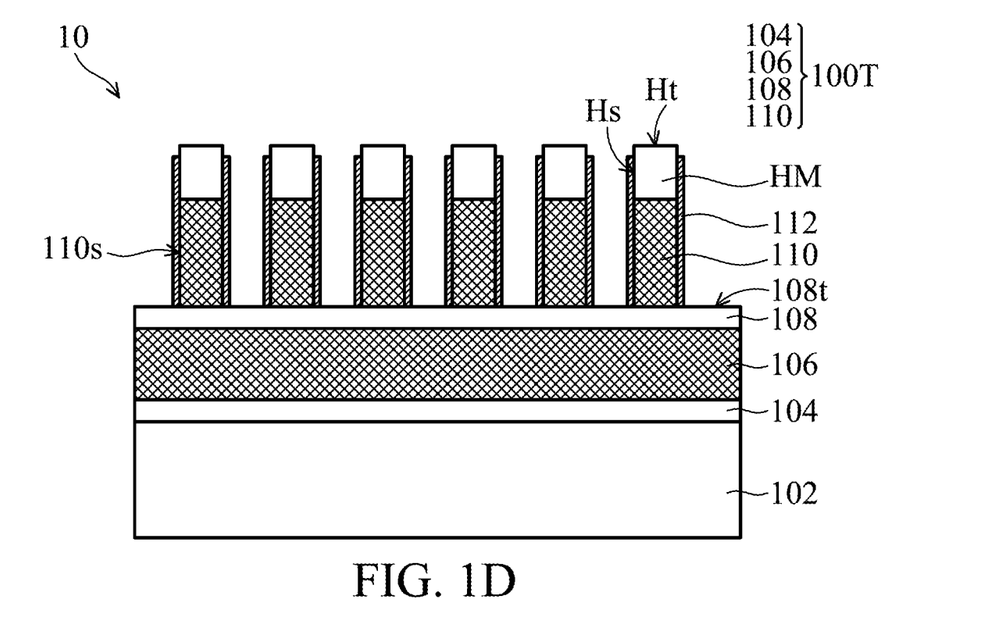
Figure 1E:
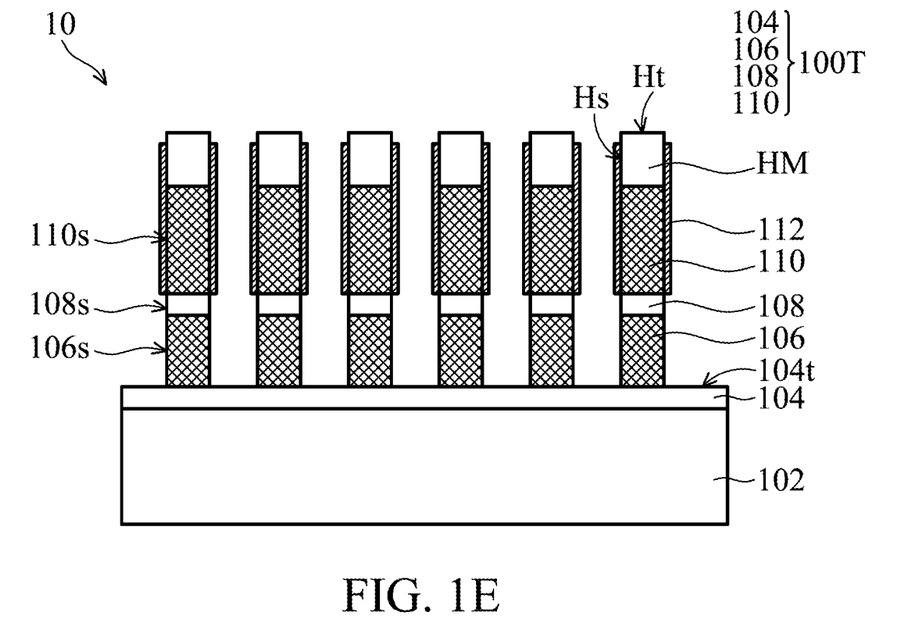

Next, as shown in FIGS. 1C to 1E, a barrier layer 112 may be formed on a portion of the sidewalls (not labeled) of the stacked structure 100T. First, referring to FIG. 1C, the barrier layer 112 may be conformally formed to cover the top surface 108t of the inter-gate dielectric layer 108, the control gate layer 110, and the hard mask layer HM. In some embodiments, the material of the barrier layer 112 may include nitride, such as silicon nitride (SiN). In some embodiments, the barrier layer 112 may be formed by a chemical vapor deposition process.

Next, referring to FIG. 1D, portions of the barrier layer 112 located on the top surface 108t of the inter-gate dielectric layer 108 and the top surface Ht of the hard mask layer HM may be removed to expose the top surface 108t of the inter-gate dielectric layer 108 and the top surface Ht of the hard mask layer HM. In some embodiments, the barrier layer 112 located on the sidewalls Hs of the top portion of the hard mask layer HM may also be partially removed. That is, the top surface (not labeled) of the barrier layer 112 may be lower than the top surface Ht of the hard mask layer HM. In addition, in this step, the barrier layer 112 on the sidewalls 110s of the control gate layer 110 is not removed. In some embodiments, the barrier layer 112 may be removed by the dry etching process.

Next, referring to FIG. 1E, portions of the inter-gate dielectric layer 108 and the floating gate layer 106 may be removed using the hard mask layer HM as an etching mask to form the patterned inter-gate dielectric layer 108 and floating gate electrode layer 106. In some embodiments, a portion of the inter-gate dielectric layer 108 may be removed to expose the sidewalls 108s of the inter-gate dielectric layer 108. In addition, in some embodiments, a portion of the floating gate layer 106 may be removed to expose the sidewalls 106s of the floating gate layer 106 and the top surface 104t of the tunneling dielectric layer 104. In some embodiments, the inter-gate dielectric layer 108 and the floating gate layer 106 may be removed by the dry etching process.

It is worth noting that, since the control gate layer 110 and the floating gate layer 106 are formed by discontinuous etching processes, the barrier layer 112 is not formed on the sidewalls 106s of the floating gate layer 106. In some embodiments, the barrier layer 112 is also not formed on the sidewalls 108s of the inter-gate dielectric layer 108. In addition, the barrier layer 112 may be formed on the sidewalls 110s of the control gate layer 110 in a self-aligned manner.

Figure 1F:
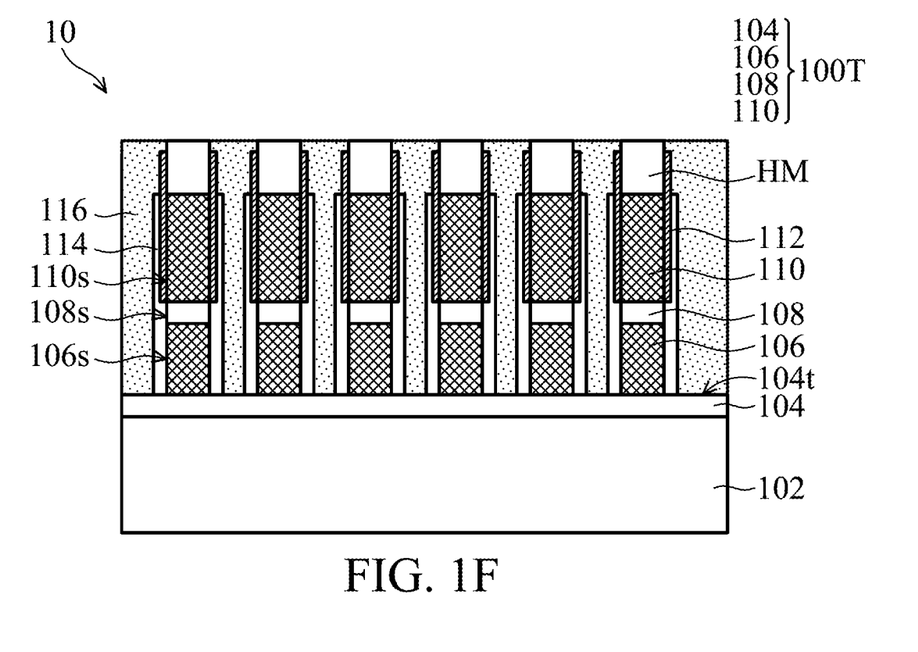

Next, referring to FIG. 1F, a spacer layer 114 may be formed on the sidewalls (not labeled) of the stacked structure 100T, and cover a portion of the barrier layer 112. Specifically, the spacer layer 114 may be formed on the sidewalls 106s of the floating gate layer 106, the sidewalls 108s of the inter-gate dielectric layer 108, and the sidewalls 110s of the control gate layer 110, and cover a portion of the barrier layer 112 so that a portion of the barrier layer 112 may be located between the stacked structure 100T and the spacer layer 114. In some embodiments, the material of the spacer layer 114 may include silicon nitride, silicon oxynitride, or a combination thereof. In some embodiments, the spacer layer 114 may be formed by a chemical vapor deposition process. In addition, the spacer layer 114 may be formed on the sidewalls of the stacked structure 100T in a self-aligned manner.

Still refer to FIG. 1F, a dielectric layer 116 may then be formed to cover the barrier layer 112 and the stacked structures 100T. Specifically, the dielectric layer 116 may fill the space between the stacked structures 100T and entirely cover the stacked structures 100T, the barrier layer 112, and the spacer layer 114. In some embodiments, the material of the dielectric layer 116 may include tetraethoxysilane (TEOS) oxide, silicon oxide, silicon nitride, silicon oxynitride, high-k dielectric materials, other suitable dielectric materials, or a combination thereof. In some embodiments, the dielectric layer 116 may be formed by a chemical vapor deposition process.

Figure 1G:
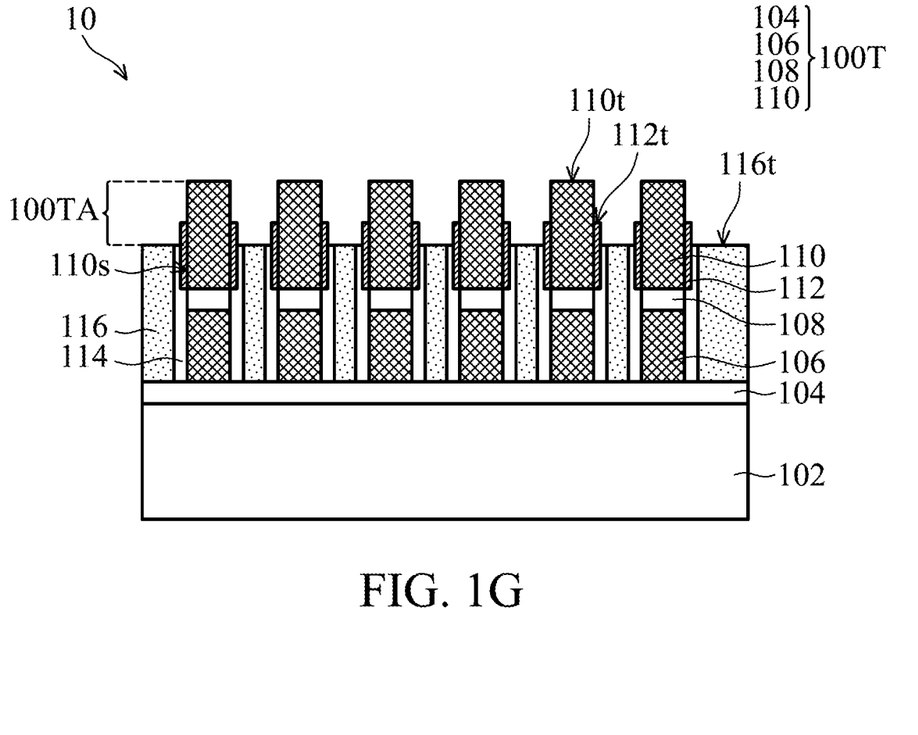

Next, referring to FIG. 1G, the hard mask layer HM located above the stacked structure 100T may be removed, and a portion of the dielectric layer 116 may be removed to expose an upper portion 100TA of the stacked structure 100T. In some embodiments, the upper portion 100TA of the stacked structure 100T may include a portion of the control gate layer 110 and a portion of the barrier layer 112. In some embodiments, removing a portion of the dielectric layer 116 may also expose a portion of the barrier layer 112. In some embodiments, after removing a portion of the dielectric layer 116, the top surface 110t of the control gate layer 110 and the top surface 112t of the barrier layer 112 may be higher than the top surface 116t of the dielectric layer 116, and the top surface 110t may be higher than the top surface 112t. In other words, a portion of the barrier layer 112 may still exist on the sidewalls 110s of the control gate layer 110.

Specifically, in some embodiments, the hard mask layer HM may be removed by the dry etching process, followed by an ion implantation process to improve the uniformity of etching, and then a wet etching process may be used to remove the dielectric layer 116 and the barrier layer 112. In some embodiments, the ion implantation process may implant ions at an inclined angle, and the inclined angle may be, for example, from 45 degrees to 89 degrees. In some embodiments, the ions used in the ion implantation process may include boron difluoride ion ($BF_2$), nitrogen ion (N: $N_2$), germanium tetrahydrogen ($GeH_4$), arsenic ion (As), and phosphorus ion (P), selenium ion (Se), antimony ion (Sb), or a combination thereof.

Figure 1H:
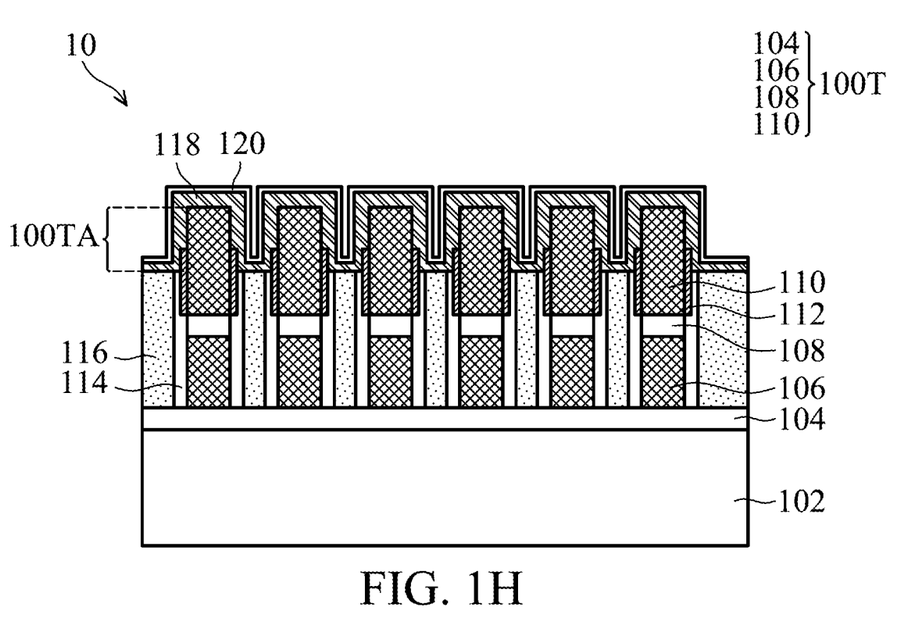

Next, referring to FIG. 1H, a metal layer 118 may be formed to cover the stacked structures 100T and the dielectric layer 116. Specifically, the metal layer 118 may be conformally formed on the upper portion 100TA, the barrier layer 112, the spacer layer 114, and the dielectric layer 116 of the stacked structure 100T. In some embodiments, the material of the metal layer 118 may include cobalt. In some embodiments, the chemical vapor deposition process, physical vapor deposition (PVD) process, electroplating process, electroless plating process, other suitable processes, or a combination thereof may be used to form the metal layer 118. The physical vapor deposition process may include, for example, a sputtering process, an evaporation process, or a pulsed laser deposition process.

In some embodiments, after the metal layer 118 is formed to cover the stacked structures 100T and the dielectric layer 116, a passivation layer (not illustrated) may be further formed on the metal layer 118 to protect the metal layer 118. In some embodiments, the material of the passivation layer may include titanium nitride (TiN). In some embodiments, the metal layer 118 and the passivation layer may be formed by a chemical vapor deposition process.

In addition, in some embodiments, after the metal layer 118 is formed to cover the stacked structures 100T and the dielectric layer 116, a dielectric layer 120 may be further formed on the metal layer 118. In some embodiments, the dielectric layer 120 may be formed on the passivation layer. In some embodiments, the material of the dielectric layer 120 may include oxide, such as silicon oxide, other suitable dielectric materials, or a combination thereof. In some embodiments, the dielectric layer 120 may be formed by a chemical vapor deposition process.

Figure 1I:
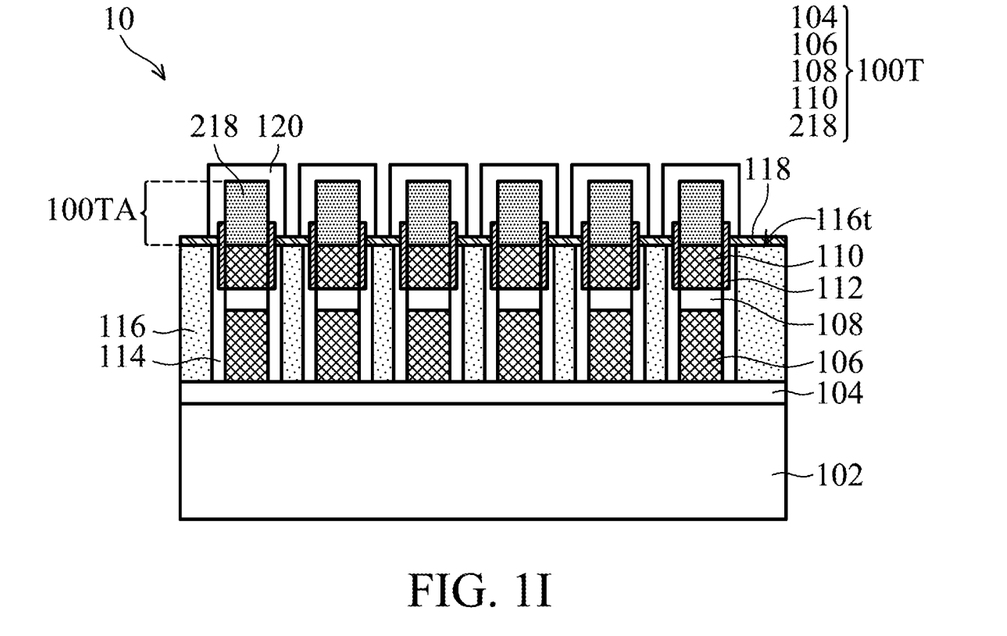

Next, referring to FIG. 1I, an annealing process may be performed to react the metal layer 118 with the stacked structure 100T to form a metal silicide layer 218 at the upper portion 100TA of the stacked structure 100T. Specifically, the metal in the metal layer 118 (e.g., cobalt) may react with the control gate layer 110 surrounding it to form the metal silicide layer 218. In some embodiments, the metal silicide layer 218 may include cobalt silicide (CoSi), cobalt disilicide ($CoSi_2$), or a combination thereof. In some embodiments, the volume of the metal silicide layer 218 formed may be slightly smaller than the original volume of the control gate layer 110. Furthermore, after the annealing process is performed to make the metal layer 118 react with the stacked structure 100T, the dielectric layer 120 may still cover the metal silicide layer 218. In some embodiments, more than one annealing process may be performed, for example, two, three, or performed by other suitable times. In some embodiments, the temperature of the annealing process may be in a range from about 450° C. to about 800° C.

It is worth noting that after the annealing process is performed, a portion of the unreacted metal layer 118 may still remain at the bottom between the upper portions 100TA of the stacked structures 100T, for example, located on the top surface 116t of the dielectric layer 116 that is between the barrier layers 112. In other words, in some embodiments, after the annealing process is performed to make the metal layer 118 react with the stacked structure 100T, the barrier layer 112 may be in contact with the metal silicide layer 218 and the unreacted portion of the metal layer 118 at the same time.

Figure 1J:
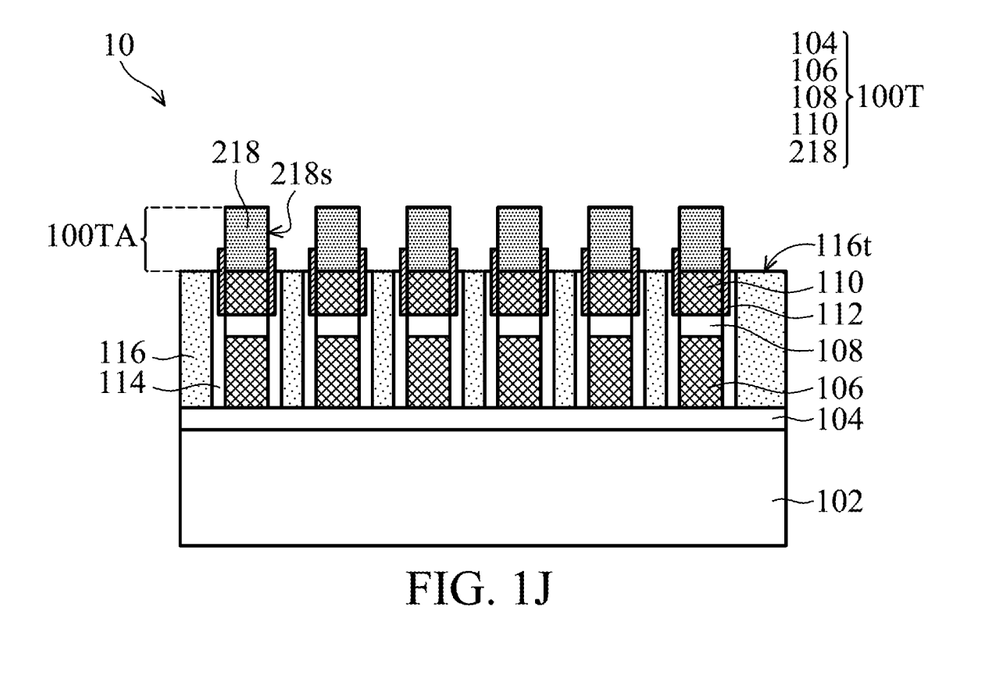

Next, referring to FIG. 1J, the dielectric layer 120 and the unreacted portions of the metal layer 118 may be removed, and the upper portions 100TA of the stacked structures 100T and the top surface 116t of the dielectric layer 116 may be exposed again. Specifically, the dielectric layer 120 may be removed to expose the metal silicide layer 218 and a portion of the barrier layer 112. Moreover, the step of removing the unreacted portion of the metal layer 118 may be performed simultaneously or separately from the step of removing the dielectric layer 120. In some embodiments, the dielectric layer 120 and the metal layer 118 may be removed by a wet etching process. In addition, in some embodiments, after the unreacted portion of the metal layer 118 and the dielectric layer 120 are removed, a portion of the barrier layer 112 may still exist on the sidewalls 218s of the metal silicide layer 218.

Figure 1K:
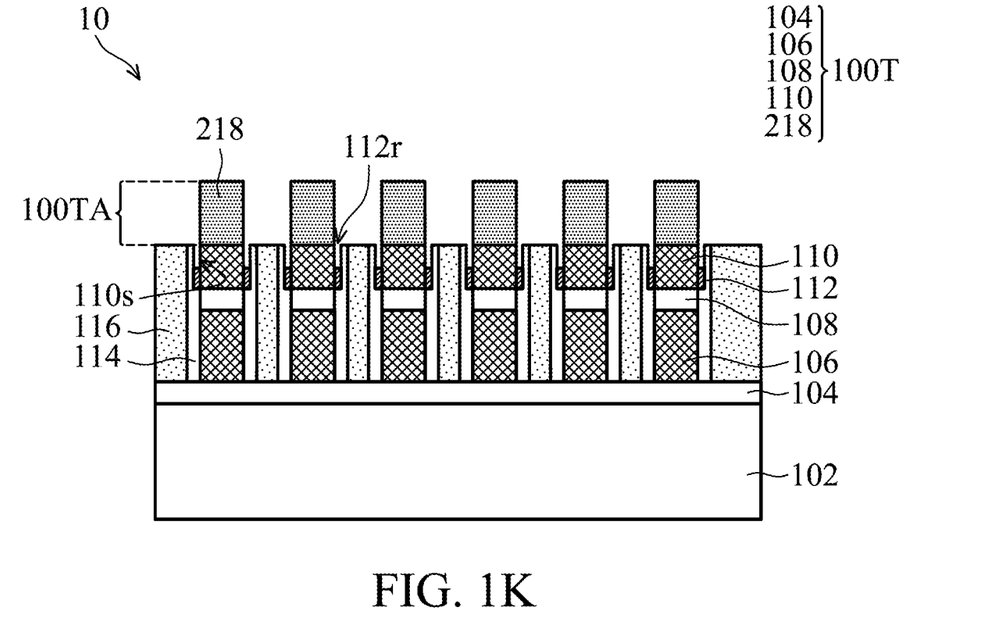

Next, referring to FIG. 1K, a portion of the barrier layer 112 may be removed to form a recess 112r above the barrier layer 112. Specifically, a portion of the barrier layer 112 that is in contact with the stacked structure 100T may be removed, so that the recess 112r may be located between the stacked structure 100T and the spacer layer 114. In some embodiments, the barrier layer 112 on the sidewalls 218s of the metal silicide layer 218 and a portion of the barrier layer 112 between the control gate layer 110 and the spacer layer 114 may be removed to form the recess 112r. In some embodiments, the space surrounded by the sidewall 110s of the control gate layer 110, the top surface 112t (not labeled) of the barrier layer 112 and the spacer layer 114 may define the recess 112r. In some embodiments, the barrier layer 112 may be removed by a wet etching process. In some embodiments, the barrier layer 112 may be removed using an etchant (e.g., phosphoric acid, $H_3PO_4$) having a high etching selectivity ratio for the barrier layer 112 and the spacer layer 114.

Figure 1L:
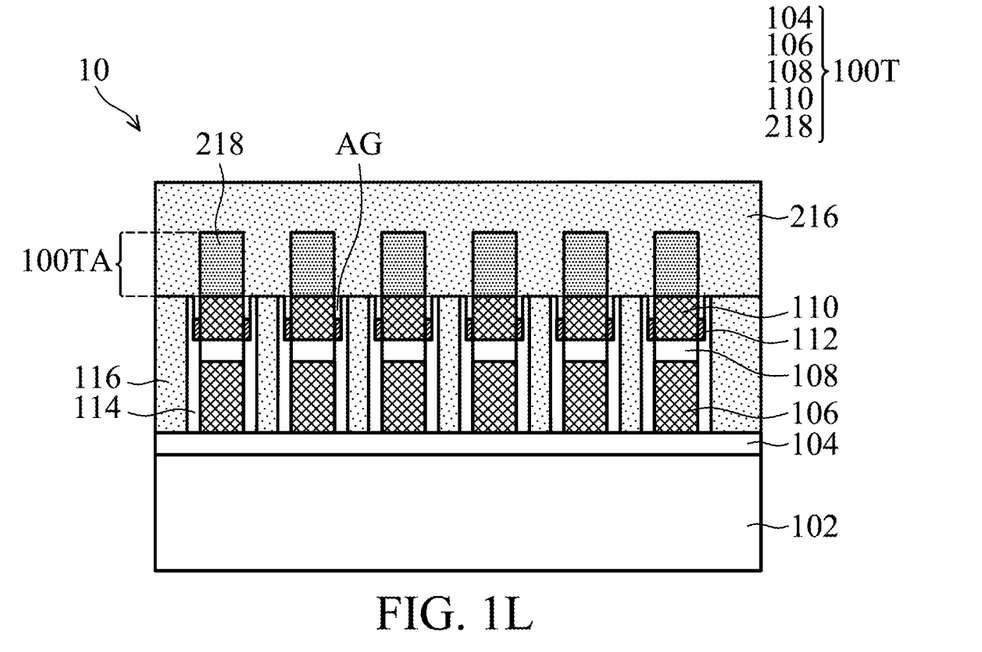

Next, referring to FIG. 1L, a dielectric layer 216 may be formed to cover the metal silicide layer 218 and the dielectric layer 116 to form air gaps AG on both sides of the stacked structure 100T. In some embodiments, a dielectric layer 216 having suitable packing density may be selected, so that the dielectric layer 216 substantially does not fill the recess 112r, thereby forming an air gap AG between the dielectric layer 216 and the barrier layer 112. Specifically, the air gap AG may be surrounded by the control gate layer 110, the barrier layer 112, the spacer layer 114 and the dielectric layer 216. In some embodiments, the material of the dielectric layer 216 may include tetraethoxysilane (TEOS) oxide, silicon oxide, silicon nitride, silicon oxynitride, high-k dielectric materials, other suitable dielectric materials, or a combination thereof. Furthermore, the material of the dielectric layer 216 may be the same as or different from the material of the dielectric layer 116. In some embodiments, the dielectric layer 216 may be formed by a chemical vapor deposition process.

It is worth noting that since the air gap AG does not electrically react with the metal silicide layer 218 or the control gate layer 110, it can effectively prevent the electrical connection between the remaining portions of the metal layer 118 or the metal silicide layer 218, thereby reducing the risk of short circuits between the stacked structures 100T (word line structures).

As shown in FIG. 1L, in accordance with some embodiments of the present disclosure, the provided semiconductor structure 10 may include the substrate 102, the stacked structure 100T, the barrier layer 112, and the air gap AG. The stacked structure 100 may be disposed on the substrate 102, the upper portion 100TA of the stacked structure 100T may include the metal silicide layer 218, and the barrier layer 112 may be disposed on a portion of the sidewalls of the stacked structure 100T and in contact with a portion of the sidewalls of the stacked structure 100T. In addition, the air gap AG may be disposed above the barrier layer 112.

Specifically, the stacked structure 100T may further include the tunneling dielectric layer 104, the floating gate layer 106, the inter-gate dielectric layer 108, and the control gate layer 110 that are sequentially stacked on the substrate 102, and the metal silicide layer 218 may be disposed on the control gate layer 110. In addition, the barrier layer 112 may be disposed on the sidewalls 110s of the control gate layer 110, but not on the sidewalls 108s (not labeled) of the inter-gate dielectric layer 108, and not on the sidewalls 106s (not labeled) of the floating gate layer 106. Moreover, the air gap AG may be in contact with the control gate layer 110.

In addition, in some embodiments, the semiconductor structure 10 may further include the spacer layer 114, the spacer layer 114 may be disposed on the sidewalls of the stacked structure 100T, and the air gap AG may be disposed between the control gate layer 110 and the spacer layer 114. Furthermore, in some embodiments, the spacer layer 114 may cover a portion of the barrier layer 112 such that the barrier layer 112 is located between the stacked structure 100T and the spacer layer 114. In some embodiments, the air gap AG may be disposed on top of the spacer layer 114 and located between the spacer layer 114 and the stacked structure 100T. In some embodiments, the semiconductor structure 10 may further include the passivation layer (not illustrated) disposed on the metal silicide layer 218.

To summarize the above, in accordance with some embodiments of the present disclosure, the provided method for forming the semiconductor structure includes forming the air gap between word line structures, thereby reducing the risk of short circuit of the word lines caused by the remaining conductive material (e.g., cobalt, cobalt silicide, etc.). In addition, compared with the conventional process of removing the remaining conductive material by a wet etching process alone, the method for forming the semiconductor structure provided by the embodiments of the present disclosure can effectively improve the RC delay effect of the memory structure, which can further improve the stability of data storage in memory structure.

Although the embodiments and advantages of this disclosure have been disclosed as above, it should be understood that any person with ordinary knowledge in the technical field can make changes, substitutions and substitutions without departing from the spirit and scope of this disclosure. Retouch. In addition, the scope of protection of this disclosure is not limited to the processes, machines, manufacturing, material composition, devices, methods and steps in the specific embodiments described in the description. Any person with ordinary knowledge in the technical field to which this disclosure pertains may disclose content from this disclosure. To understand the current or future development of processes, machines, manufacturing, material composition, devices, methods and steps, as long as they can implement substantially the same functions or achieve approximately the same results in the embodiments described herein, they can be used according to this disclosure. Therefore, the scope of protection of this disclosure includes the aforementioned processes, machines, manufacturing, material composition, devices, methods and steps. In addition, each patent application scope constitutes a separate embodiment, and the protection scope of this disclosure also includes a combination of each patent application scope and embodiment. The scope of protection of this disclosure shall be determined by the scope of the appended patent application.

What is claimed is:

1. A semiconductor structure, comprising:
   a substrate;
   a stacked structure disposed on the substrate, wherein an upper portion of the stacked structure comprises a metal silicide layer;
   a barrier layer disposed on a portion of a sidewall of the stacked structure and in contact with a portion of the sidewall of the stacked structure;
   an air gap disposed above the barrier layer; and
   a spacer layer disposed on the sidewall of the stacked structure, wherein a portion of the spacer layer is disposed directly under the air gap.

2. The semiconductor structure as claimed in claim 1, wherein the stacked structure further comprises a tunneling dielectric layer, a floating gate layer, an inter-gate dielectric layer and a control gate layer that are sequentially stacked on the substrate, and the metal silicide layer is disposed on the control gate layer.

3. The semiconductor structure as claimed in claim 2, wherein the barrier layer is disposed on a sidewall of the control gate layer.

4. The semiconductor structure as claimed in claim 2, wherein the barrier layer is not disposed on a sidewall of the inter-gate dielectric layer.

5. The semiconductor structure as claimed in claim 2, wherein the barrier layer is not disposed on a sidewall of the floating gate layer.

6. The semiconductor structure as claimed in claim 2, wherein the air gap is in contact with the control gate layer.

7. The semiconductor structure as claimed in claim 2, wherein the air gap is disposed between the control gate layer and the spacer layer.

8. The semiconductor structure as claimed in claim 1, wherein the spacer layer further covers a portion of the barrier layer so that the barrier layer is located between the stacked structure and the spacer layer.

9. The semiconductor structure as claimed in claim 8, wherein the air gap is disposed on top of the spacer layer and is located between the spacer layer and the stacked structure.

10. The semiconductor structure as claimed in claim 1, wherein a material of the metal silicide layer comprises cobalt silicide, cobalt disilicide, or a combination thereof.

11. A method for forming the semiconductor structure as set forth in claim 1, comprising:
providing the substrate;
forming the stacked structure on the substrate;
forming the barrier layer on the portion of the sidewall of the stacked structure;
forming a first dielectric layer covering the barrier layer and the stacked structure;
removing a portion of the first dielectric layer to expose the upper portion of the stacked structure;
forming a metal layer covering the stacked structure and the first dielectric layer;
performing an annealing process to react the metal layer with the stacked structure to form a metal silicide layer at the upper portion of the stacked structure;
removing an unreacted portion of the metal layer;
removing a portion of the barrier layer to form a recess above the barrier layer; and
forming a second dielectric layer covering the metal silicide layer and the first dielectric layer to form air gaps on both sides of the stacked structure.

12. The method as claimed in claim 11, after forming the barrier layer on the portion of the sidewall of the stacked structure, further comprising:
forming a spacer layer on the sidewall of the stacked structure and covering a portion of the barrier layer.

13. The method as claimed in claim 11, wherein removing the portion of the first dielectric layer also exposes a portion of the barrier layer.

14. The method as claimed in claim 11, after forming the metal layer covering the stacked structure and the first dielectric layer, further comprising:
forming a passivation layer on the metal layer.

15. The method as claimed in claim 11, wherein after performing the annealing process to react the metal layer with the stacked structure to form the metal silicide at the upper portion of the stacked structure, the barrier layer is in contact with the metal silicide layer and the unreacted portion of the metal layer.

16. The method as claimed in claim 11, after forming the metal layer covering the stacked structure and the first dielectric layer, further comprising:
forming a third dielectric layer on the metal layer.

17. The method as claimed in claim 16, wherein after performing the annealing process to react the metal layer with the stacked structure to form a metal silicide layer at the upper portion of the stacked structure, the third dielectric layer covers the metal silicide layer.

18. The method as claimed in claim 16, further comprising:
removing the third dielectric layer to expose the metal silicide layer and a portion of the barrier layer.

19. The method as claimed in claim 12, wherein a portion of the barrier layer that is in contact with the stacked structure is removed so that the recess is located between the stacked structure and the spacer layer.

20. The method as claimed in claim 11, wherein after forming the second dielectric layer covering the metal silicide layer and the first dielectric layer, the second dielectric layer substantially does not fill the recess.

\* \* \* \* \*